United States Patent
Orris et al.

(10) Patent No.: US 11,355,872 B2
(45) Date of Patent: Jun. 7, 2022

(54) MEZZANINE POWER PIN FOR AN ELECTRICAL CONNECTOR SYSTEM

(71) Applicant: TE Connectivity Services GmbH, Schaffhausen (CH)

(72) Inventors: David Patrick Orris, Middletown, PA (US); Martin William Bayes, Hopkinton, MA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 17/026,399

(22) Filed: Sep. 21, 2020

(65) Prior Publication Data

US 2022/0094087 A1    Mar. 24, 2022

(51) Int. Cl.
*H01R 12/00* (2006.01)
*H01R 12/71* (2011.01)
*H01R 12/70* (2011.01)

(52) U.S. Cl.
CPC ....... *H01R 12/712* (2013.01); *H01R 12/7088* (2013.01)

(58) Field of Classification Search
CPC .......................... H01R 23/722; H01R 23/725; H01R 23/6658; H01R 23/7073; H01R 12/585; H01R 13/20; H01R 13/6315; H01K 3/368
USPC ......... 439/66, 74, 75, 76.1, 79, 82, 324, 248
See application file for complete search history.

(56) References Cited

U.S. PATENT DOCUMENTS

| | | | | |
|---|---|---|---|---|
| 3,904,934 A * | 9/1975 | Martin | ................. | H01R 12/714 361/803 |
| 4,029,375 A * | 6/1977 | Gabrielian | ........... | H01R 12/714 439/66 |
| 4,939,624 A * | 7/1990 | August | ................ | H01R 12/523 361/714 |
| 6,338,629 B1 * | 1/2002 | Fisher | .................. | G01R 1/0416 439/66 |
| 6,540,525 B1 * | 4/2003 | Li | ......................... | H01R 12/523 439/331 |
| 7,422,441 B2 * | 9/2008 | Planelle | ............. | G01R 31/2889 439/482 |
| 7,463,041 B2 * | 12/2008 | Kazama | ............. | G01R 1/06722 324/755.05 |
| 7,527,502 B2 * | 5/2009 | Li | ...................... | H01R 13/2421 439/70 |

OTHER PUBLICATIONS

TE Connectivity, C-2204913-2, Kit, "Power Pin with Insulation Coat", Rev. A-1, Mar. 13, 2019, 1 pg.

* cited by examiner

*Primary Examiner* — Phuong Chi Thi Nguyen

(57) ABSTRACT

A mezzanine power pin includes a dual layer pin body extending between a pin top having an upper power interface and a pin bottom having a lower power interface. The dual layer pin body has a base metal core and an outer metal oxide layer combined with the base metal core defining an outermost layer of the dual layer pin body. The mezzanine power pin includes an upper fastener coupled to the pin top to mechanically and electrically connect an upper component to the upper power interface. The mezzanine power pin includes a lower fastener coupled to the pin bottom to mechanically and electrically connect a lower component to the lower power interface. The base metal core is configured to electrically connect the upper component and the lower component through the base metal core.

20 Claims, 3 Drawing Sheets

MEZZANINE POWER PIN FOR AN ELECTRICAL CONNECTOR SYSTEM

BACKGROUND OF THE INVENTION

The subject matter herein relates generally to power for electrical connector systems.

Electrical components of an electrical connector system are electrically connected through various components or devices. For example, some electrical connector systems include circuit boards that are electrically connected through connectors or other components. Some known electrical connector systems have circuit boards arranged in a stacked configuration. Mezzanine connectors are typically provided to transfer data between the circuit boards. However, some known electrical connector systems require power to be transmitted between the stacked circuit boards. Mezzanine connectors are limited in the amount of power that may be transferred between the circuit boards. Additionally, the power circuits may interfere with the data transmission through the mezzanine connectors. Some known electrical connector systems use separate mezzanine power connectors. However, the use of separate connectors for data and power pads significant cost to the electrical connector system.

Other known electrical connector systems use power pins between the stacked circuit boards to transfer power between the circuit boards. However, known power pins are not without disadvantages. For example, the power pins are typically manufactured from copper base material. The copper base material has a high cost. Additionally, the copper base material is typically plated with one or more layers to enhance characteristics of the power pins adding manufacturing steps and costs associated with the additional manufacturing steps and additional plating materials. Furthermore, the copper power pins have secondary insulation applied to the exterior of the power pins, adding manufacturing steps and costs associated with the additional manufacturing steps and additional insulating materials.

A need remains for a cost effective and reliable mezzanine power pin for use in electrical connector systems having stacked electrical components.

BRIEF DESCRIPTION OF THE INVENTION

In one embodiment, a mezzanine power pin is provided. The mezzanine power pin includes a dual layer pin body extending between a pin top and a pin bottom. The pin top has an upper power interface. The pin bottom has a lower power interface. The dual layer pin body has a base metal core and an outer metal oxide layer combined with the base metal core. The outer metal oxide layer defines an outermost layer of the dual layer pin body. The mezzanine power pin includes an upper fastener coupled to the pin top. The upper fastener is configured to mechanically and electrically connect an upper component to the upper power interface. The mezzanine power pin includes a lower fastener coupled to the pin bottom. The lower fastener is configured to mechanically and electrically connect a lower component to the lower power interface. The base metal core is configured to electrically connect the upper component and the lower component through the base metal core.

In another embodiment, a mezzanine power pin is provided. The mezzanine power pin includes a dual layer pin body extending between a pin top and a pin bottom. The pin top has an upper power interface. The pin bottom has a lower power interface. The dual layer pin body has an extruded aluminum core and an anodized outer aluminum oxide layer combined with the extruded aluminum core. The anodized outer aluminum oxide layer defines an outermost layer of the dual layer pin body. The mezzanine power pin includes an upper fastener coupled to the pin top. The upper fastener is configured to mechanically and electrically connect an upper component to the upper power interface. The mezzanine power pin includes a lower fastener coupled to the pin bottom. The lower fastener is configured to mechanically and electrically connect a lower component to the lower power interface. The extruded aluminum core is configured to electrically connect the upper component and the lower component through the extruded aluminum core.

In a further embodiment, an electrical connector system is provided. The electrical connector system includes an upper component having an upper component substrate and an upper component power circuit. The upper component substrate has an upper surface and a lower surface. The upper component substrate has an opening therethrough. The upper component substrate has an upper component power pad at the opening. The electrical connector system includes a lower component having a lower component substrate and a lower component power circuit. The lower component substrate has an upper surface and a lower surface. The lower component substrate has an opening therethrough. The lower component substrate has a lower component power pad at the opening. The electrical connector system includes a mezzanine power pin electrically connecting the upper component and the lower component. The mezzanine power pin includes a dual layer pin body, an upper fastener coupled to the upper component and a lower fastener coupled to the lower component. The dual layer pin body extends between a pin top and a pin bottom. The pin top has an upper power interface coupled to the lower surface of the upper component. The upper fastener extends through the opening of the upper component and coupled to the pin top. The pin bottom has a lower power interface coupled to the upper surface of the lower component. The lower fastener extends through the opening in the lower component and coupled to the pin bottom. The dual layer pin body has a base metal core and an outer metal oxide layer combined with the base metal core. The outer metal oxide layer defines an outermost layer of the dual layer pin body. The base metal core electrically connects the upper component and the lower component through the base metal core.

DETAILED DESCRIPTION OF THE INVENTION

Figure 1:
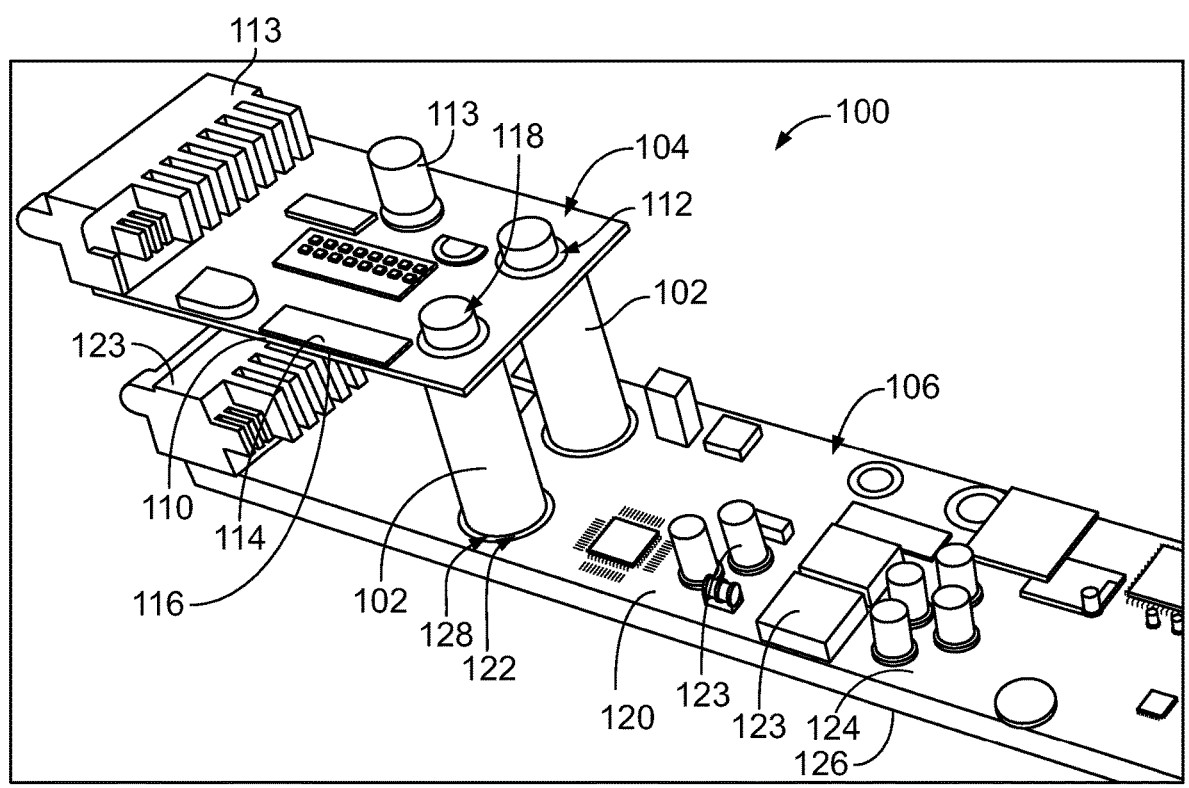
FIG. 1 illustrates an electrical connector system in accordance with an exemplary embodiment.

FIG. 1 illustrates an electrical connector system 100 in accordance with an exemplary embodiment. The electrical connector system 100 includes one or more mezzanine power pins 102 used to transfer power between a first or upper component 104 and a second or lower component 106. The upper and lower components 104, 106 are stacked in a component stack with the upper component 104 located above the lower component 106. The mezzanine power pins 102 extend between the upper and lower components 104, 106. In an exemplary embodiment, the upper component 104 is arranged parallel to and spaced apart from the lower component 106. The lower component 106 may be a host component such as a motherboard and the upper component 104 may be a takeoff component such as a daughter card. In the illustrated embodiment, a pair of the mezzanine power pins 102 are provided, such as an anode power pin and a cathode power pin. However, greater or fewer power pins 102 may be provided in alternative embodiments.

In an exemplary embodiment, the upper component 104 includes an upper component substrate 110 and an upper component power circuit 112. The upper component power circuit 112 may include one or more upper component power pads (shown, for example in FIG. 4) configured to be electrically connected to the one or more mezzanine power pins 102. The upper component power circuit 112 may be electrically connected to one or more upper electrical components 113 mounted to the upper component substrate 110. The upper electrical components 113 may include a connector, a processor, a capacitor, or another type of electrical component. The upper component substrate 110 includes an upper surface 114 and a lower surface 116. The upper electrical component 113 may be mounted to the upper surface 114 and/or the lower surface 116. The upper component substrate 110 includes one or more openings 118 therethrough. The mezzanine power pins 102 are coupled to the upper component substrate 110 at the openings 118. The upper component power pads may be provided at the openings 118, such as along the upper surface 114 and/or the lower surface 116 and/or other layers of the upper component substrate 110.

In an exemplary embodiment, the upper component substrate 110 includes an upper component circuit board having circuits forming the upper component power circuit 112. The opening 118 in the upper component circuit board may be a plated via extending between the upper surface 114 and the lower surface 116. The upper component power pads may be formed by conductors or circuit of the upper component circuit board at the upper surface 114 and/or the lower surface 116 and or other layers of the upper component circuit board. In other various embodiments, the upper component substrate 110 may be a busbar, such as a metal plate or bar forming the upper component power circuit 112.

In an exemplary embodiment, the lower component 106 includes a lower component substrate 120 and a lower component power circuit 122. The lower component power circuit 122 may include one or more lower component power pads configured to be electrically connected to the one or more mezzanine power pins 102. The lower component power circuit 122 may be electrically connected to one or more lower electrical components 123 mounted to the lower component substrate 120. The lower electrical components 123 may include a connector, a processor, a capacitor, or another type of electrical component. The lower component substrate 120 includes an upper surface 124 and a lower surface 126. The lower electrical component 123 may be mounted to the upper surface 124 and/or the lower surface 126. The lower component substrate 120 includes one or more openings 128 therethrough. The mezzanine power pins 102 are coupled to the lower component substrate 120 at the openings 128. The lower component power pads may be provided at the openings 128, such as along the lower surface 124 and/or the lower surface 126 and/or other layers of the lower component substrate 120.

In an exemplary embodiment, the lower component substrate 120 includes a lower component circuit board having circuits forming the lower component power circuit 122. The opening 128 in the lower component circuit board may be a plated via extending between the upper surface 124 and the lower surface 126. The lower component power pads may be formed by conductors or circuit of the lower component circuit board at the upper surface 124 and/or the lower surface 126 and or other layers of the lower component circuit board. In other various embodiments, the lower component substrate 120 may be a busbar, such as a metal plate or bar forming the lower component power circuit 122.

Figure 2:
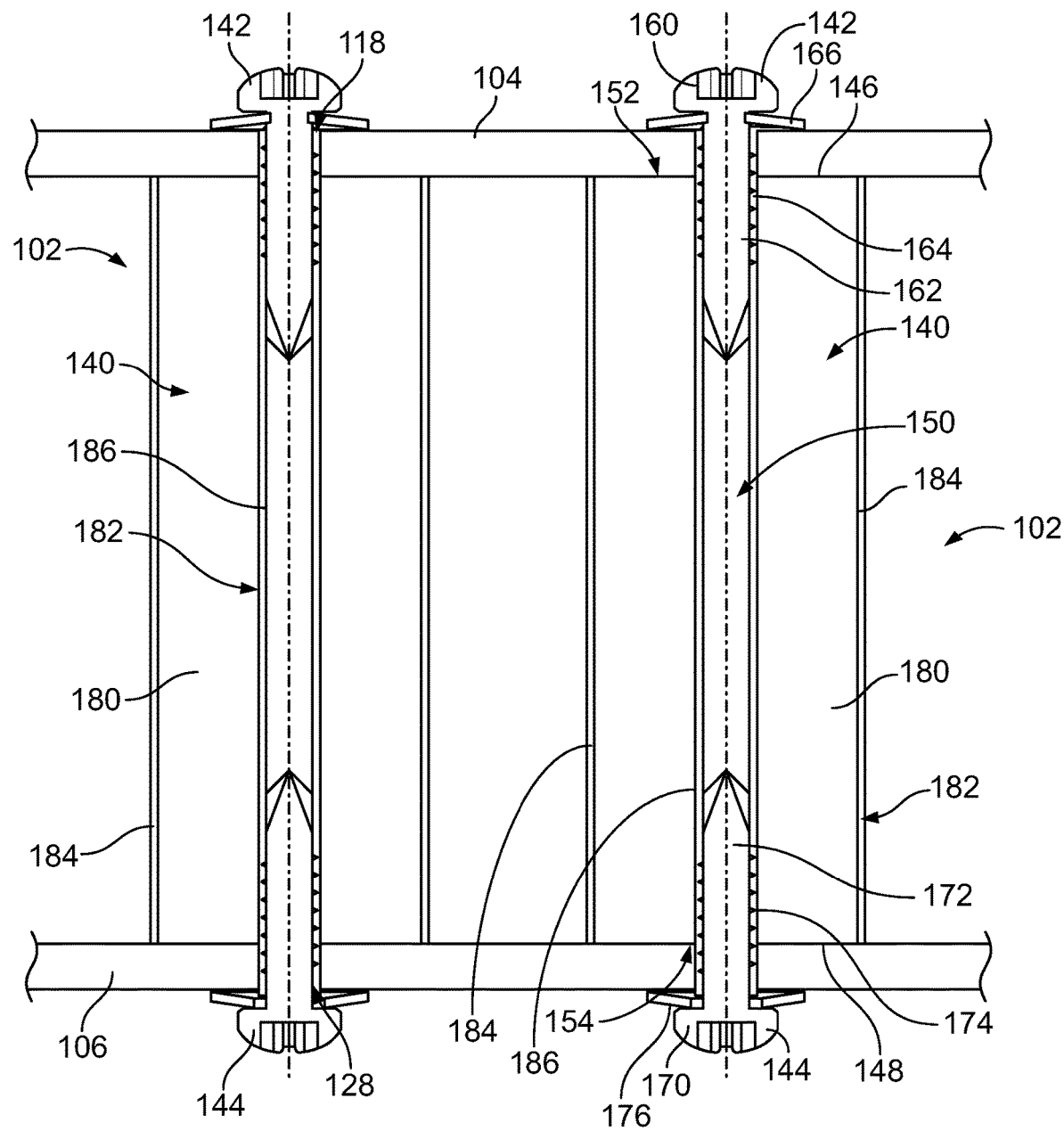
FIG. 2 is an end view of the electrical connector system showing a mezzanine power pin in accordance with an exemplary embodiment.
Figure 3:
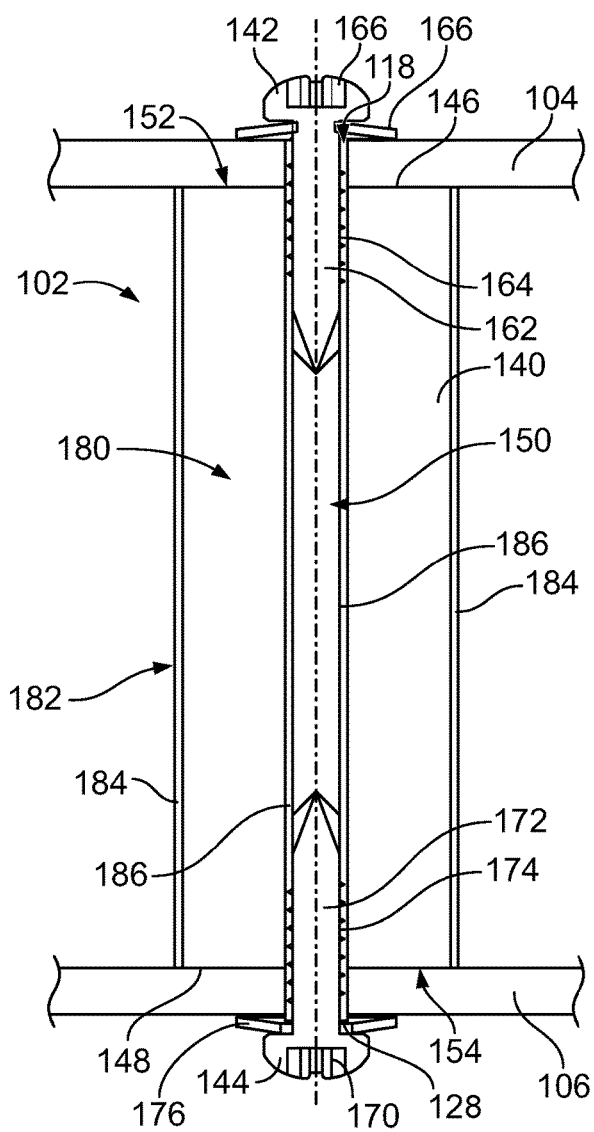
FIG. 3 is a side view of the electrical connector system showing mezzanine power pins in accordance with an exemplary embodiment.

FIG. 2 is an end view of the electrical connector system 100 showing the mezzanine power pin 102 in accordance with an exemplary embodiment. FIG. 3 is a side view of the electrical connector system 100 showing the mezzanine power pins 102 in accordance with an exemplary embodiment. The mezzanine power pins 102 to electrically connect the upper component 104 and the lower component 106. For example, the mezzanine power pins 102 transfer power between the lower component 106 and the upper component 104. In various embodiments, the mezzanine power pins 102 may be identical.

The mezzanine power pin 102 includes a dual layer pin body 140, an upper fastener 142, and a lower fastener 144. The upper fastener 142 mechanically and electrically connects the dual layer pin body 140 to the upper component 104. The lower fastener 144 mechanically and electrically connects the dual layer pin body 140 to the lower component 106. The dual layer pin body 140 extends between a pin top 146 and the pin bottom 148. In an exemplary embodiment, the dual layer pin body includes a central bore 150 extending between the pin top 146 and the pin bottom 148. The central bore 150 may be filled with air. Alternatively, the central bore 150 may be filled with filler material. The filler material may be dielectric material, such as epoxy. Alternatively, the filler material may be conductive, such as being a conductive polymer or a metal material. The dual layer pin body 140 includes an upper power interface 152 at the pin top 146 and a lower power interface 154 at the pin bottom 148. The upper fastener 142 is coupled to the upper power interface 152 at the pin top 146. The upper power interface 152 is electrically connected to the upper component 104 at the pin top 146. For example, the upper power interface 152 engages the upper power circuit 112 at the lower surface 116 of the upper component substrate 110. The lower fastener 144 is coupled to the lower power interface 154 at the pin bottom 148. The lower power interface 154 is electrically connected to the lower component 106 at the pin bottom 148. For example, the lower power interface 154 engages the lower power circuit 122 at the upper surface 124 of the lower component substrate 120.

In an exemplary embodiment, the upper fastener 142 is a threaded fastener having a head 160 and a threaded shaft 162 including threads 164. The threaded shaft 162 is received in the central bore 150 to mechanically and electrically connect the upper fastener 142 to the dual layer pin body 140. In an exemplary embodiment, the upper fastener 142 is a self tapping screw. The threads 164 pierce the dual layer pin body 140 to mechanically and electrically connect the upper fastener 142 to the dual layer pin body 140. In an exemplary embodiment, the upper fastener 142 includes a coned disk spring 166 at the head 160. The coned disk spring 166 may be a Belleville washer. The coned disk spring 166 engages the upper component 104 to preload the upper fastener 142 against the upper component 104. The coned disk spring 166 creates spring tension between the dual layer pin body 140 and the upper component 104 to hold the dual layer pin body 140 in electrical connection with the upper component power circuit 112.

In an exemplary embodiment, the lower fastener 142 is a threaded fastener having a head 170 and a threaded shaft 172 including threads 174. The threaded shaft 172 is received in the central bore 150 to mechanically and electrically connect the lower fastener 142 to the dual layer pin body 140. In an exemplary embodiment, the lower fastener 142 is a self tapping screw. The threads 174 pierce the dual layer pin body 140 to mechanically and electrically connect the lower fastener 142 to the dual layer pin body 140. In an exemplary embodiment, the lower fastener 142 includes a coned disk spring 176 at the head 170. The coned disk spring 176 may be a Belleville washer. The coned disk spring 176 engages the lower component 104 to preload the lower fastener 142 against the lower component 104. The coned disk spring 176 creates spring tension between the dual layer pin body 140 and the lower component 104 to hold the dual layer pin body 140 in electrical connection with the lower component power circuit 122.

The dual layer pin body 140 includes a base metal core 180 and a metal oxide layer 182 combined with the base metal core 180. In an exemplary embodiment, the base metal core 180 is oxidized during an energizing process to form the metal oxide layer 182. For example, the base metal ions of the base metal core 180 are combined with oxygen ions at the surface of the base metal core 180 and the metal oxide layer 182. In various embodiments, the base metal is aluminum. For example, the base metal core 180 is an aluminum core. In such embodiments, the metal oxide layer 182 is an aluminum oxide layer. Other base metals may be used in alternative embodiments.

In an exemplary embodiment, the metal oxide layer 182 includes an outer metal oxide layer 184 and an inner metal oxide layer 186 enclosing the base metal core 180. The outer metal oxide layer 184 defines an outermost layer of the dual layer pin body 140. For example, the outer metal oxide layer 184 forms an exterior of the dual layer pin body 140. The inner metal oxide layer 186 extends along the central bore 150. For example, the inner metal oxide layer 186 lines the central bore 150 between the central bore 150 and the base metal core 180. In alternative embodiments, the dual layer pin body 140 is provided without the inner metal oxide layer 186.

In an exemplary embodiment, the dual layer pin body 140 is formed by extruding a metal rod from a metal material, such as aluminum. The extruded metal rod is anodized during an anodizing process to form the dual layer pin body 140. For example, the metal rod may be immersed in an acid electrolyte bath with electric current passing through the medium to anodize the surface of the extruded metal rod. The anodizing process is an electrolytic passivation process used to form the metal oxide layer 182 on the surface of the metal rod. The metal rod may be anodized to form the metal oxide layer 182 of a particular thickness. In various embodiments, the metal rod is anodized until the process has a particular amperage value equating to a desired thickness of the metal oxide layer. In other various embodiments, the metal rod is anodized at a particular amperage value for a predetermined time required to form a desired thickness of the metal oxide layer. The extruded metal rod is anodized to increase resistance to corrosion and wear for the dual layer pin body 140. For example, the outer metal oxide layer 184 is harder than the base metal core 180 to increase where resistance for the mezzanine power pin 102. The outer metal oxide layer 184 formed by the anodizing process forms an insulator on the exterior of the dual layer pin body 140, making the mezzanine power pin 102 touch safe. The inner metal oxide layer 186 formed by the anodizing process creates an environmental seal, such as a gas tight seal, between the fasteners 142, 144 and the dual layer pin body 140.

The metal rod may be extruded to any suitable length. In an exemplary embodiment, the metal rod may be cut into pieces to form a plurality of the pin bodies 140. In various embodiments, the metal rod may be extruded with the central bore 150. For example, the extruded metal rod may be a hollow metal rod. However, in alternative embodiments, the extruded metal rod may be a solid metal rod without the central bore 150 extruded there with. In such embodiments, the central bore 150 may be formed at a later time by a drilling process, for example. Alternatively, the dual layer pin body 140 may be solid rather than having the central bore 150. In various embodiments, the metal rod is cylindrical shaped; however, the metal rod may have other shapes, such as square, rectangular or other shapes.

The base metal core 180 electrically connects the upper component 104 and the lower component 106 through the material of the base metal core 180. For example, the base metal core 180 is electrically conductive, whereas the metal oxide layer 182 is electrically intellective. The base metal core 180 has a higher electrical conductivity compared to the metal oxide layer 182. The powers transmitted between the upper power interface 152 and the lower power interface 154 through the base metal core 180. The base metal core 180 includes base metal ions, such as aluminum ions, whereas the metal oxide layer 182 includes the base metal ions combined with oxygen ions. The anodizing process changes the microscopic texture of the dual layer pin body and the crystal structure of the dual layer pin body 140 near the surface. For example, the oxygen ions combined with the base metal ions at the surface of the dual layer pin body 140 (for example, exterior surface and interior surface along the central bore 150) to form the metal oxide layer 182. The outer metal oxide layer 182 is located directly on the base metal core 180 without any other layers or coatings. For example, the metal oxide layer 182 forms an electrical insulator, the corrosion barrier, and provides where resistance for the dual layer pin body 140 such that the dual layer pin body 140 does not need further platings or coatings, which reduces the number of manufacturing steps and costs associated with plating and coating.

In an exemplary embodiment, the dual layer pin body 140 is formed by cutting the dual layer pin body 140 from the extruded, anodized metal rod (for example, the dual layer pin body 140 is a piece of the extruded, anodized metal rod). When cut, the base metal core 180 is exposed at the pin top 146 and the pin bottom 148 to directly engage with the upper component 104 and the lower component 106, respectively. For example, the exposed base metal core 180 at the pin top 146 in the pin bottom 148 may directly engage the upper component power circuit 112 and the lower component power circuit 122, respectively. The coned disk springs 166, 176 press the upper component 104 and the lower component 106 inward against the base metal core 180 of the dual layer pin body 140 and/or pull the base metal core 180 of the dual layer pin body 140 outward against the upper component 104 or the lower component 106. In various embodiments, the coned disk springs 166, 176 may be electrically connected to the upper component power circuit 112 in the lower component power circuit 122, respectively. For example, the coned disk springs 166, 176 may press directly against the upper component power circuit 112 and the lower component power circuit 122, respectively.

Figure 4:
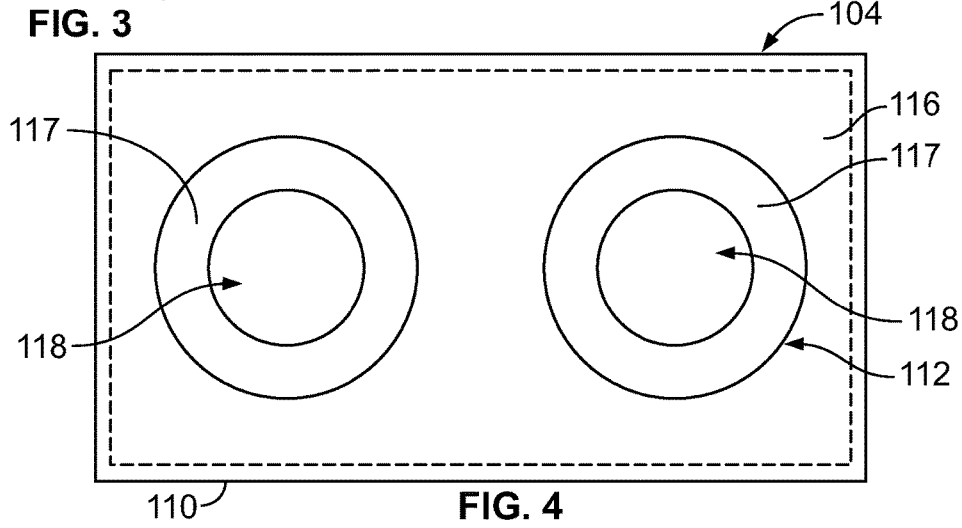
FIG. 4 is a bottom view of a portion of an upper component of the electrical connector system in accordance with an exemplary embodiment.

FIG. 4 is a bottom view of a portion of the upper component 104 in accordance with an exemplary embodiment. FIG. 4 shows power pads 117 at the lower surface 116 around the openings 118. Similar power pads may be provided at the upper surface 114 (shown in FIG. 1). The upper fasteners 142 (shown in FIG. 3) are configured to pass through the openings 118 to threadably coupled to the dual layer pin body 140 (shown in FIG. 3). The base metal core 180 of the dual layer pin body 140 is configured to engage the power pad 117 to electrically connect the dual layer pin body 140 to the upper component 104.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A mezzanine power pin comprising:
   a dual layer pin body extending between a pin top and a pin bottom, the pin top having an upper power interface, the pin bottom having a lower power interface, the dual layer pin body having a base metal core and an outer metal oxide layer combined with the base metal core, the outer metal oxide layer defining an outermost layer of the dual layer pin body;
   an upper fastener coupled to the pin top, the upper fastener configured to mechanically and electrically connect an upper component to the upper power interface; and
   a lower fastener coupled to the pin bottom, the lower fastener configured to mechanically and electrically connect a lower component to the lower power interface;
   wherein the base metal core is configured to electrically connect the upper component and the lower component through the base metal core.

2. The mezzanine power pin of claim 1, wherein the base metal core is an extruded base metal core.

3. The mezzanine power pin of claim 1, wherein the base metal core is an extruded aluminum core.

4. The mezzanine power pin of claim 1, wherein the outer metal oxide layer is an anodized oxide layer directly on the base metal core.

5. The mezzanine power pin of claim 1, wherein the outer metal oxide layer is an aluminum oxide layer.

6. The mezzanine power pin of claim 1, wherein the base metal core is comprised of base metal ions, the outer metal oxide layer is comprised of the base metal ions combined with oxygen ions.

7. The mezzanine power pin of claim 1, wherein the base metal core is an inner layer of the dual layer pin body and the outer metal oxide layer is directly on the base metal core, the dual layer pin body including no other layers.

8. The mezzanine power pin of claim 1, wherein the base metal core includes a central bore, the central bore receiving the upper fastener and the lower fastener.

9. The mezzanine power pin of claim 1, wherein the base metal core is exposed at the pin top to directly engage the upper component and the base metal core is exposed at the pin bottom to directly engage the lower component.

10. The mezzanine power pin of claim 1, wherein the base metal core has a higher electrical conductivity compared to the outer metal oxide layer, the outer metal oxide layer being harder than the base metal core.

11. The mezzanine power pin of claim 1, wherein the base metal core has a higher electrical conductivity compared to the outer metal oxide layer, the outer metal oxide layer having higher wear resistance than the base metal core.

12. The mezzanine power pin of claim 1, wherein the outer metal oxide layer is an insulator.

13. The mezzanine power pin of claim 1, wherein the outer metal oxide layer provides a corrosion barrier for the base metal core.

14. The mezzanine power pin of claim 1, wherein the upper fastener includes a coned disk spring configured to preload at least one of the upper fastener and the upper power interface against an upper power pad of the upper component to electrically connect the dual layer pin body to a power circuit of the upper component, and wherein the lower fastener includes a coned disk spring configured to preload at least one of the lower fastener and the lower power interface against a lower power pad of the lower component to electrically connect the dual layer pin body to a power circuit of the lower component.

15. The mezzanine power pin of claim 1, wherein the base metal core includes a central bore, the central bore having an inner metal oxide layer directly on the base metal core within the central bore.

16. The mezzanine power pin of claim 15, wherein the upper fastener is a threaded fastener including threads, the threads piercing through the inner metal oxide layer to electrically connect the upper fastener to the base metal core, and wherein the lower fastener is a threaded fastener including threads, the threads piercing through the inner metal oxide layer to electrically connect the lower fastener to the base metal core.

17. A mezzanine power pin comprising:
   a dual layer pin body extending between a pin top and a pin bottom, the pin top having an upper power interface, the pin bottom having a lower power interface, the dual layer pin body having an extruded aluminum core and an anodized outer aluminum oxide layer combined with the extruded aluminum core, the anodized outer aluminum oxide layer defining an outermost layer of the dual layer pin body;

an upper fastener coupled to the pin top, the upper fastener configured to mechanically and electrically connect an upper component to the upper power interface; and a lower fastener coupled to the pin bottom, the lower fastener configured to mechanically and electrically connect a lower component to the lower power interface;

wherein the extruded aluminum core is configured to electrically connect the upper component and the lower component through the extruded aluminum core.

18. An electrical connector system comprising:

an upper component having an upper component substrate and an upper component power circuit, the upper component substrate having an upper surface and a lower surface, the upper component substrate having an opening therethrough, the upper component substrate having an upper component power pad at the opening;

a lower component having an lower component substrate and a lower component power circuit, the lower component substrate having an upper surface and a lower surface, the lower component substrate having an opening therethrough, the lower component substrate having a lower component power pad at the opening; and a mezzanine power pin electrically connecting the upper component and the lower component, the mezzanine power pin including a dual layer pin body, an upper fastener coupled to the upper component and a lower fastener coupled to the lower component, the dual layer pin body extending between a pin top and a pin bottom, the pin top having an upper power interface coupled to the lower surface of the upper component, the upper fastener extending through the opening of the upper component and coupled to the pin top, the pin bottom having a lower power interface coupled to the upper surface of the lower component, the lower fastener extending through the opening in the lower component and coupled to the pin bottom, the dual layer pin body having a base metal core and an outer metal oxide layer combined with the base metal core, the outer metal oxide layer defining an outermost layer of the dual layer pin body, the base metal core electrically connecting the upper component and the lower component through the base metal core.

19. The electrical connector system of claim 18, wherein the upper component is an upper circuit board and the lower component is a lower circuit board.

20. The electrical connector system of claim 18, wherein the base metal core is exposed at the pin top to directly engage the upper component power pad and the base metal core is exposed at the pin bottom to directly engage the lower component power pad.

* * * * *